United States Patent

Matsumoto et al.

[11] Patent Number: 5,856,926
[45] Date of Patent: Jan. 5, 1999

[54] LOGIC SYNTHESIS METHOD AND SYSTEM WITH INTERMEDIATE CIRCUIT FILES

[75] Inventors: Kazuhiko Matsumoto, Kawasaki; Takao Shinsha, Yokohama; Nobuyuki Hayashi, Hadano; Hiromoto Sakaki, Yokohama; Miyako Tandai, Atsugi; Yasunori Yamada, Sagamihara; Takahiro Nakata; Kaoru Moriwaki, both of Hadano; Junji Koshishita, Hiratsuka, all of Japan

[73] Assignees: Hitachi, Ltd., Tokyo; Hitachi Software Engineering Co., Ltd., Yokohama, both of Japan

[21] Appl. No.: 599,090

[22] Filed: Feb. 7, 1996

[30] Foreign Application Priority Data

Feb. 8, 1995 [JP] Japan ................................. 7-020139

[51] Int. Cl.[6] .................................................. G06F 17/50
[52] U.S. Cl. ........................... 364/490; 364/488; 364/489
[58] Field of Search ............................ 395/500; 364/488, 364/489, 490, 491

[56] References Cited

U.S. PATENT DOCUMENTS

| | | | |
|---|---|---|---|
| 5,287,289 | 2/1994 | Kageyama et al. | 364/489 |
| 5,331,569 | 7/1994 | Iijima | 364/489 |
| 5,436,849 | 7/1995 | Drumm | 364/490 |
| 5,473,547 | 12/1995 | Muroga | 364/489 |
| 5,537,330 | 7/1996 | Damiano et al. | 364/489 |
| 5,587,919 | 12/1996 | Cheng et al. | 364/489 |

*Primary Examiner*—Kevin J. Teska
*Assistant Examiner*—Tyrone V. Walker
*Attorney, Agent, or Firm*—Antonelli, Terry, Stout & Kraus, LLP

[57] ABSTRACT

An incremental logic synthesis system for generating an optimized circuit from given logic, wherein the optimized circuit satisfies a design constriction. The system includes a logic input device for inputting an old logic, an old circuit generated from the old logic and optimized to satisfy the design constriction, and a new logic partially changing from the old logic file, a logic synthesizing device for generating a first intermediate circuit file from the new logic file, a discriminating device for discriminating a common sub-circuit of the old circuit having an equivalent logic function and an uncommon sub-circuit of the first intermediate circuit having an inconsistent logic function, from the old circuit and the first intermediate circuit, a circuit updating device for generating a second intermediate circuit file by merging the common sub-circuit of the old circuit and the uncommon sub-circuit of the first intermediate circuit, and an optimizing device for optimizing the uncommon sub-circuit of the second intermediate circuit so as to satisfy the design constriction.

17 Claims, 13 Drawing Sheets

FIG. 6

| G_J \ G_I | 421 | 422 | 423 | 424 | 425 | 426 | 427 |
|---|---|---|---|---|---|---|---|
| 521 | $50\left(\frac{1}{1}+\frac{1}{1}\right)$ =100 | / | / | $50\left(\frac{1}{2}+\frac{1}{1}\right)$ =75 | $50\left(\frac{1}{3}+\frac{1}{1}\right)$ =67 | / | / |
| 522 | | $50\left(\frac{2}{2}+\frac{2}{2}\right)$ =100 | $50\left(\frac{1}{2}+\frac{1}{2}\right)$ =50 | $50\left(\frac{1}{2}+\frac{1}{2}\right)$ =50 | $50\left(\frac{2}{3}+\frac{2}{2}\right)$ =83 | $50\left(\frac{2}{3}+\frac{2}{2}\right)$ =83 | $50\left(\frac{2}{3}+\frac{2}{2}\right)$ =83 |
| 523 | | $50\left(\frac{1}{2}+\frac{1}{2}\right)$ =50 | $50\left(\frac{1}{2}+\frac{1}{2}\right)$ =50 | / | $50\left(\frac{1}{3}+\frac{1}{2}\right)$ =42 | $50\left(\frac{1}{3}+\frac{1}{2}\right)$ =42 | $50\left(\frac{1}{3}+\frac{1}{2}\right)$ =42 |
| 524 | $50\left(\frac{1}{1}+\frac{1}{3}\right)$ =67 | $50\left(\frac{2}{2}+\frac{2}{3}\right)$ =83 | $50\left(\frac{1}{2}+\frac{1}{3}\right)$ =42 | $50\left(\frac{2}{2}+\frac{2}{3}\right)$ =83 | $50\left(\frac{3}{3}+\frac{3}{3}\right)$ =100 | $50\left(\frac{2}{3}+\frac{2}{3}\right)$ =67 | $50\left(\frac{2}{3}+\frac{2}{3}\right)$ =67 |
| 525 | | $50\left(\frac{2}{2}+\frac{2}{3}\right)$ =83 | $50\left(\frac{1}{2}+\frac{1}{3}\right)$ =42 | $50\left(\frac{1}{2}+\frac{1}{3}\right)$ =42 | $50\left(\frac{2}{3}+\frac{2}{3}\right)$ =67 | $50\left(\frac{2}{3}+\frac{2}{3}\right)$ =67 | $50\left(\frac{2}{3}+\frac{2}{3}\right)$ =67 |
| 526 | | $50\left(\frac{1}{2}+\frac{1}{3}\right)$ =42 | $50\left(\frac{1}{2}+\frac{1}{3}\right)$ =42 | / | $50\left(\frac{1}{3}+\frac{1}{3}\right)$ =33 | $50\left(\frac{1}{3}+\frac{1}{3}\right)$ =33 | $50\left(\frac{1}{3}+\frac{1}{3}\right)$ =33 |
| 527 | | $50\left(\frac{2}{2}+\frac{2}{3}\right)$ =83 | $50\left(\frac{1}{2}+\frac{1}{3}\right)$ =42 | $50\left(\frac{1}{2}+\frac{1}{3}\right)$ =42 | $50\left(\frac{2}{3}+\frac{2}{3}\right)$ =67 | $50\left(\frac{2}{3}+\frac{2}{3}\right)$ =67 | $50\left(\frac{2}{3}+\frac{2}{3}\right)$ =67 |

FIG. 7

| G_J \ G_I | 426 | 427 |
|---|---|---|
| 525 | / | / |
| 527 | / | $50\left(\frac{1}{1}+\frac{1}{1}\right)$ =100 |

$X = (A+B) \cdot (\overline{C} \cdot \overline{D} + E)$
$Y = (C+D) \cdot \overline{E}) \overline{E} \cdot \overline{F} \cdot (H+I) \cdot \overline{G} + J)$
$Z = (\overline{H} \cdot \overline{I} + G) \cdot J$

\* STANDS FOR ALL PRIMARY INPUT TERMINALS $S = \overline{A \cdot B} + \overline{C \cdot D}$ $T = A \cdot B + C \cdot D$

LOGIC SYNTHESIS METHOD AND SYSTEM WITH INTERMEDIATE CIRCUIT FILES

CROSS REFERENCE TO RELATED APPLICATIONS

This invention is related to a U.S. patent application Ser. No. 911,461 entitled "INCREMENTAL LOGIC SYNTHESIS METHOD" filed by T. Shinsha et al. on Sep. 25, 1986 now issued as U.S. Pat. No. 4,882,690, the disclosure of which is incorporated herein by reference.

BACKGROUND OF THE INVENTION

1. Field of the Invention

The present invention relates to a logic synthesis method for generating logic circuit data from given functional-level logic data. More particularly, the invention relates to logic synthesis or incremental logic synthesis for generating, when an old logic before updating and an old circuit optimized to satisfy design requirements are present, a new circuit optimized to satisfy the design requirements based on a new logic partially changing from the old logic.

2. Description of the Related Art

In order to improve the efficiency of logic design of a digital system, logic design is generally performed by using a logic synthesis system which generates a logic circuit from given functional-level logic. It is essential that a logic synthesis system generates an optimized circuit satisfying design requirements, from given functional-level logic. Such an optimization function is provided in most of logic synthesis systems including commercially available systems. With these systems having an optimization function, the structure of a generated circuit becomes very different from the old circuit even if a change in the new logic is small.

An incremental logic synthesis method for generating a new circuit based on the new functional-level logic is described in the specification of U.S. Pat. No. 4,882,690, wherein when an old logic before updating and an old circuit generated from the old logic are present, a new circuit preserving design information of the portions which need not be modified is generated from a new logic partially different from the old logic.

FIG. 1 illustrates an operation environment, namely a logic synthesis process of a conventional incremental logic synthesis method. The left portion (200 to 213) of FIG. 1 shows the process flow of initial design. For the initial design, a system for capturing a functional-level logic representative of a function generates a functional-level file or old logic (step 200). A logic synthesis system generates a circuit file from the functional-level file or old logic (steps 210, 201 and 211). A layout system generates a circuit file with physical design information from the first circuit file (steps 202 and 212). If necessary, a circuit capture system generates a circuit file or old circuit with physical design information and manually optimized logic design information (steps 203 and 213).

The right portion (200 to 217) of FIG. 1 shows a process flow for logic change. For the logic change, the logic capture system updates the functional-level logic or old logic to generate an updated functional-level file or new logic (steps 200 and 214). The logic synthesis system generates an updated circuit file from the updated functional-level file or new logic (steps 201 and 215). A circuit updating system generates an updated circuit file with physical design information and manually optimized logic design information of the portions which need not be modified, from the updated circuit file and the circuit file with physical design information and manually optimized logic design information (steps 204, and 216). The circuit capture system manually provides physical design information of added or modified circuit portions, and if necessary, the circuit is further manually optimized to generate an updated circuit file or new circuit with physical design information and manually optimized logic design information (steps 203 and 207). The above-described incremental logic synthesis method assumes the use of a logic synthesis system inputted with a functional-level logic describing at least one flip-flop and at least one optimized Boolean equation, wherein the circuit updating system identifies the portions of the old circuit which need not be modified in accordance with the comparison of the structures between the old and new circuits.

If design requirements are very severe, the conventional logic synthesis system requires a very long optimization process time in order to satisfy the design requirements, resulting in a very long total time of logic synthesis. Therefore, with this logic synthesis system, the design time required for each logic change becomes long. Although an incremental logic synthesis method may be generally effective for solving this problem, the circuit updating system of the above-described conventional incremental logic synthesis method identifies the portions of the old circuit which need not be modified in accordance with the comparison of the structures between the old and new circuits. Therefore, if the generated circuit structure changes, identification of corresponding gate pairs through the structure comparison is hardly possible, so that optimization information of the old circuit can be hardly preserved.

SUMMARY OF THE INVENTION

It is an object of the present invention to provide a logic synthesis method capable of solving the above problems and considerably shortening a process time required for a logic synthesis system for dealing with logic change.

It is another object of the present invention to provide incremental logic synthesis capable of dispensing with duplicated circuit optimization steps and shortening the process time of generating an optimized circuit satisfying design requirements.

According to the present invention, there is provided an incremental logic synthesis system for generating an optimized circuit from given logic, wherein the optimized circuit satisfies a design constriction. The system includes logic capture apparatus for inputting an old logic, an old circuit generated from the old logic and optimized to satisfy the design constriction, and a new logic partially changing from the old logic file, logic synthesizing apparatus for generating a first intermediate circuit file from the new logic file, discriminating apparatus for discriminating a common sub-circuit of the old circuit having an equivalent logic function and an uncommon sub-circuit of the first intermediate circuit having an inconsistent logic function, from the old circuit and the first intermediate circuit and circuit updating apparatus for generating a second intermediate circuit file by merging the common sub-circuit of the old circuit and the uncommon sub-circuit of the first intermediate circuit. The system also includes optimizing apparatus for optimizing the uncommon sub-circuit of the second intermediate circuit so as to satisfy the design constriction. The logic synthesizing apparatus converts a Boolean algebra expression in a logic file into a corresponding gate circuit expression, a corresponding flip-flop circuit expression, and an interconnection circuit expression for interconnecting the corresponding gate circuit expression and the corresponding flip-flop circuit expression. The optimizing apparatus includes a judgement unit for judging whether at least one of the conditions selected from a group consisting of the number of gates in the circuit, a power consumption of the circuit, and a layout of the circuit is satisfied or not, and for displaying the judgement result.

The logic synthesizing, discriminating/updating, and circuit optimizing apparatus generate a new circuit satisfying design restrictions, from new logic at high speed.

BRIEF DESCRIPTION OF THE DRAWINGS

FIG. 6 is a diagram showing an example of calculations of a common primary input signal ratio.

FIG. 7 is a diagram showing an example of calculations of a common output FF ratio.

DETAILED DESCRIPTION OF THE PREFERRED EMBODIMENTS

Embodiments of the invention will be described in detail with reference to the accompanying drawings. First, an operation environment (logic synthesis flow) of a logic synthesis system (incremental logic synthesis system) of this invention will be described with reference to FIG. 2.

Figure 1:
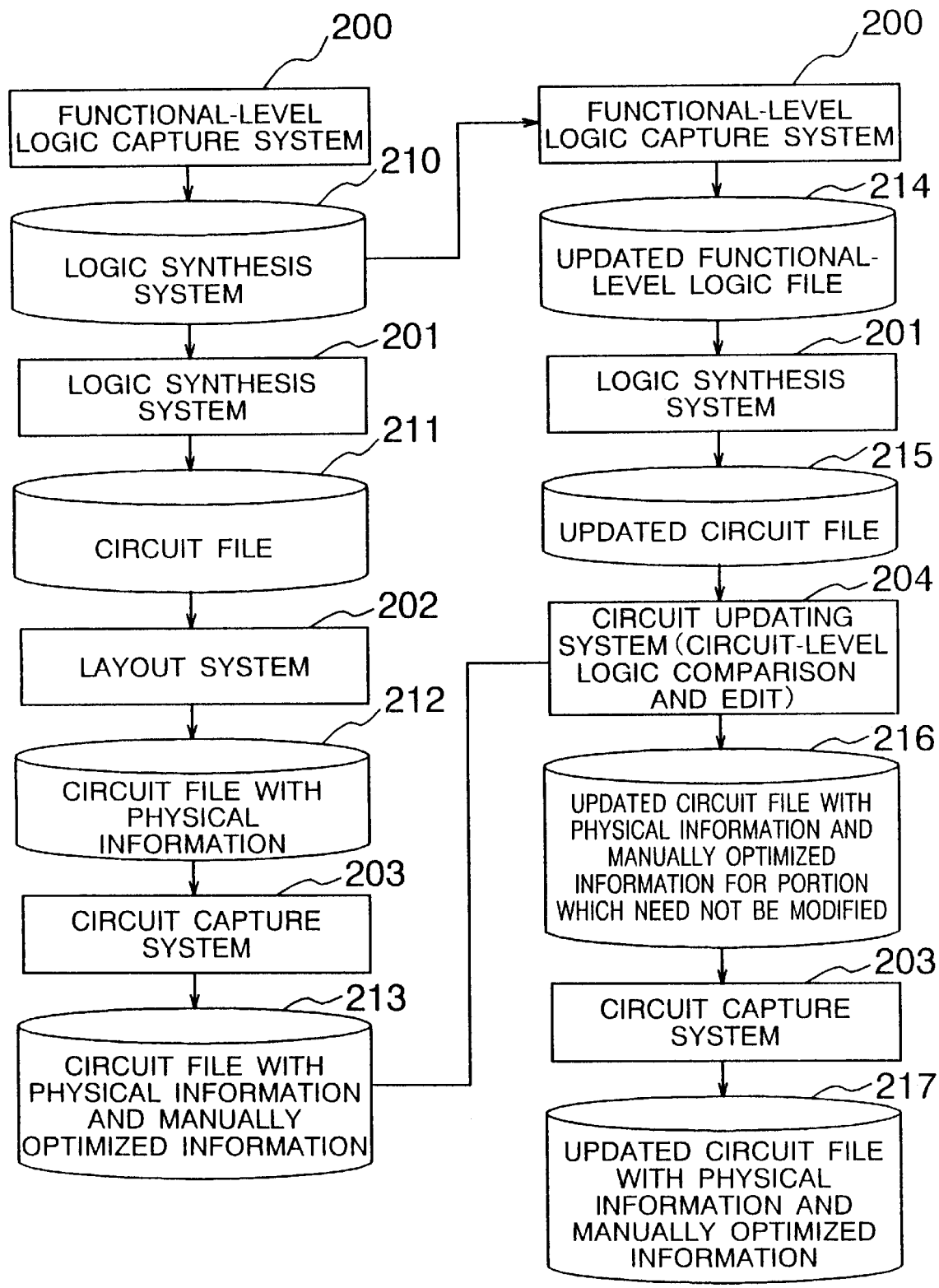
FIG. 1 is a flow chart illustrating conventional incremental logic synthesis.
Figure 2:
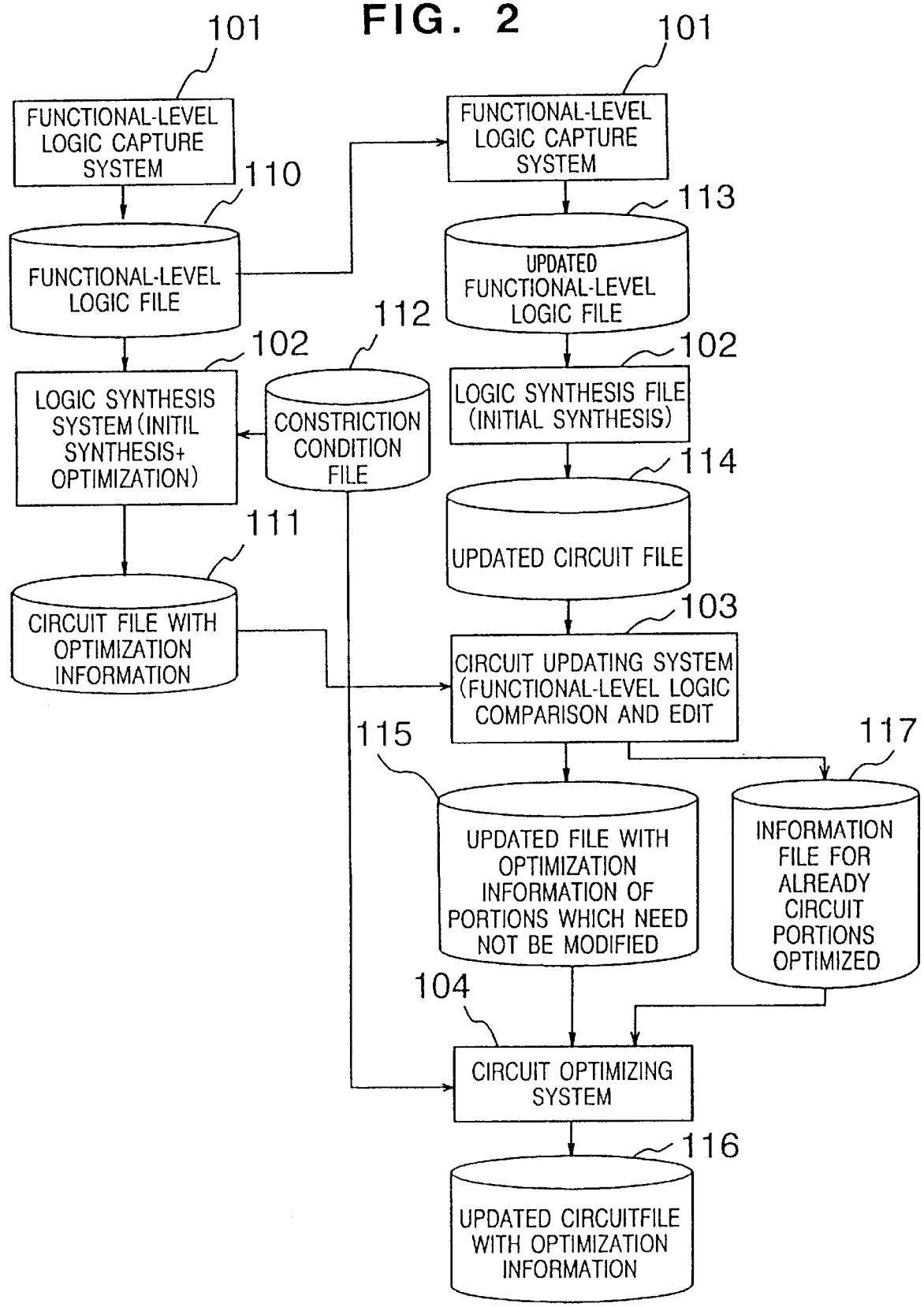
FIG. 2 is a flow chart illustrating incremental logic synthesis according to the invention.

The left portion (101 to 111) of FIG. 2 illustrates a process flow of initial design. A functional-level logic capture system 101 generates a functional-level logic file 110, and a logic synthesis system 102 generates a circuit file 111 with optimization information through initial synthesis and optimization, while referring to a constriction condition file 112.

The right portion (101 to 116) of FIG. 2 illustrates a process flow of logic design change. The functional-level logic capture system 101 updates the functional-level logic file 110 and generates an updated functional-level logic file 113. A logic synthesis system 102 performs only initial synthesis without optimization to generate an updated circuit file 114. Inputted with this file 114 and the circuit file 111 with optimization information, a circuit updating system 103 generates an updated circuit file 115 with optimization information of the circuit portions which need not be modified, and an information file 117 of the circuit portions already optimized. Inputted with these files 115 and 117, a circuit optimizing system 104 refers to the constriction condition file 112 and optimizes only the circuit portions to be modified, to generate an updated circuit file 116 with optimization information.

Figure 3:
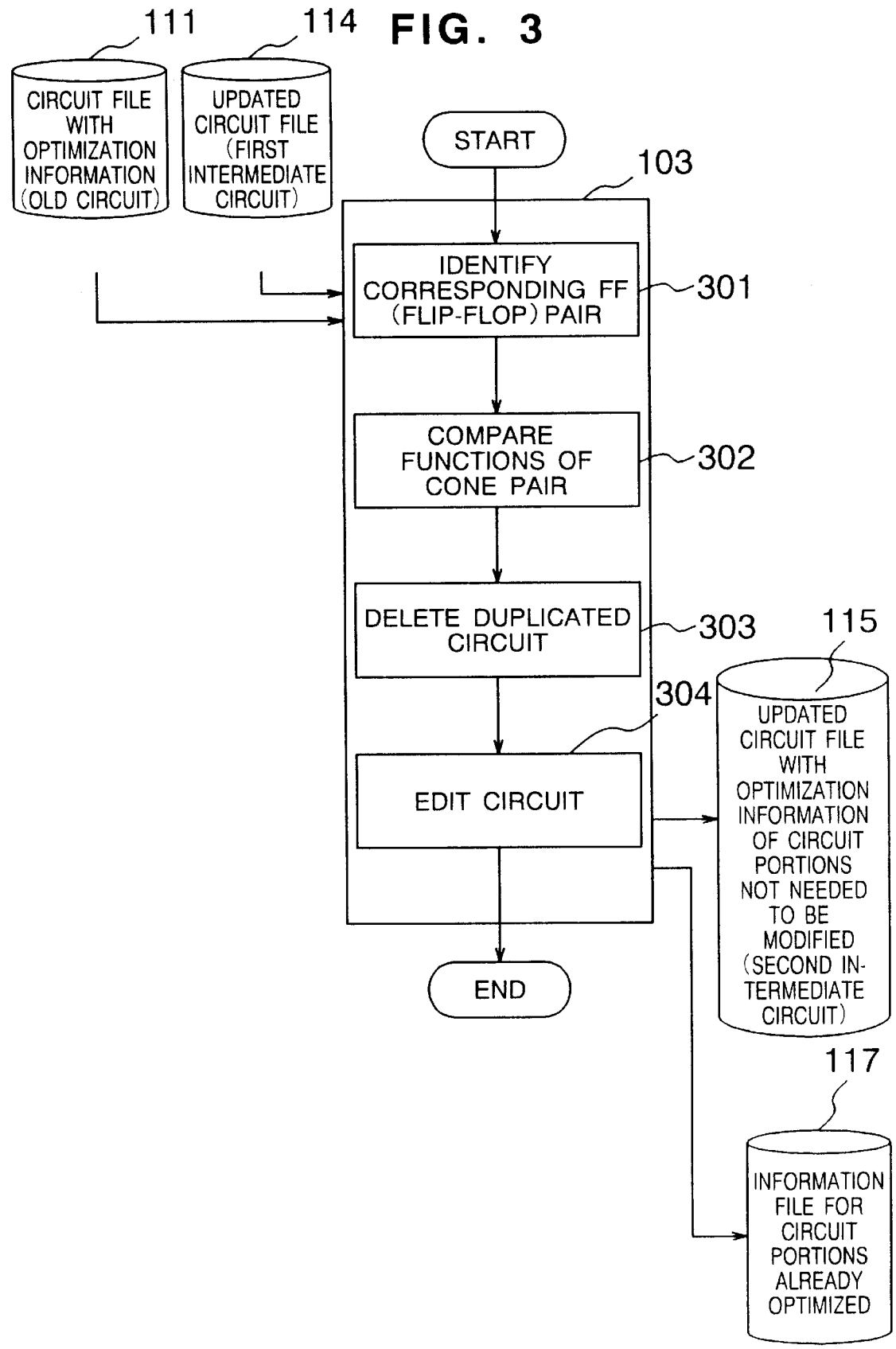
FIG. 3 is a flow chart illustrating a discriminating and updating process.

FIG. 3 is a flow chart of a circuit updating process by the circuit updating system 103. The circuit updating procedure will be described with reference to the flow chart of FIG. 3.

Step 301:

An old circuit before logic change (the contents of the circuit file 111 with optimization information) and a first intermediate circuit after logic change (the contents of the updated circuit file 114) are inputted to identify at least one corresponding FF (flip-flop) pair in the old and first intermediate circuits. At this step, corresponding FF pairs are identified based on the following four indices.

(1) Common primary input signal ratio: Rcis(Gi,Gj) Rcis(Gi,Gj)=50(Ncis(Gi,Gj)/Nis(Gi)+Ncis(Gi,Gj)/Nis(Gj))

where Nis(Gi) and Nis(Gj) are numbers of primary input signals which determine the output logical values of an FF Gi of the old circuit and an FF Gj of the first intermediate circuit. Ncis(Gi, Gj) is the number of common signals in the primary input signals of Gi and Gj.

(2) Common primary output signal ratio: Rcos(Gi,Gj) Rcos(Gi,Gj)=50(Ncos(Gi,Gj)/Nos(Gi)+Ncos(Gi,Gj)/Nos(Gj))

where Nos(Gi) and Nos(Gj) are numbers of primary output signals which are determined by the output logical values of each of FF Gi and FF Gj. Ncos(Gi, Gj) is the number of common signals in the primary output signals of Gi and Gj.

(3) Common input FF ratio: Rcif(Gi,Gj) Rcif(Gi,Gj)=50 (Ncif(Gi,Gj)/Nif(Gi)+Ncif(Gi,Gj)/Nif(Gj))

where Nif(Gi) and Nif(Gj) are numbers of input FFs (FF which can be reached via a path through a combinational logic when a fan-in-trace is performed from the input terminal of FF to the input side) or primary input signals connected to the input terminal of each Gi and Gj. Ncif(Gi, Gj) represents the number of FF pairs identified as corresponding FF pairs among respective input FFs of Gi and Gj and the number of common signals among primary input signals.

(4) Common output FF ratio: Rcof(Gi,Gj) Rcof(Gi,Gj)= 50(Ncof(Gi,Gj)/Nof(Gi)+Ncof(Gi,Gj)/Nof(Gj))

where Nof(Gi) and Nof(Gj) are numbers of output FFs (FF which can be reached via a path through a combined logic when a fan-out-trace is performed from the output terminal of FF to the output side) or primary output signals connected to the output terminal of each Gi and Gj. Ncof(Gi,Gj) represents the number of FF pairs identified as corresponding FF pairs among respective output FFs of Gi and Gj and the number of common signals among primary output signals.

The procedure of this step is similar to the method of identifying a corresponding gate pair described in U.S. Pat. No. 4,882,690. Thus, a detailed description of the step is omitted and only an example will be described.

Figure 4:
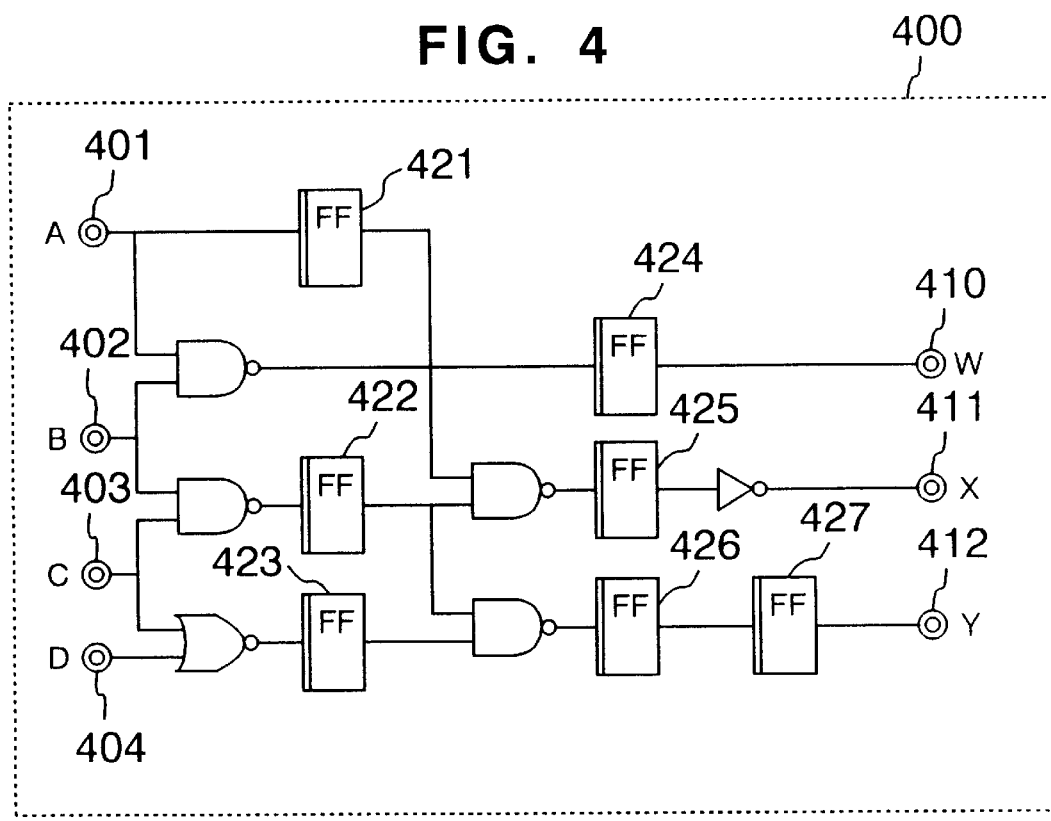
FIG. 4 is a diagram showing examples of an old circuit.
Figure 5:
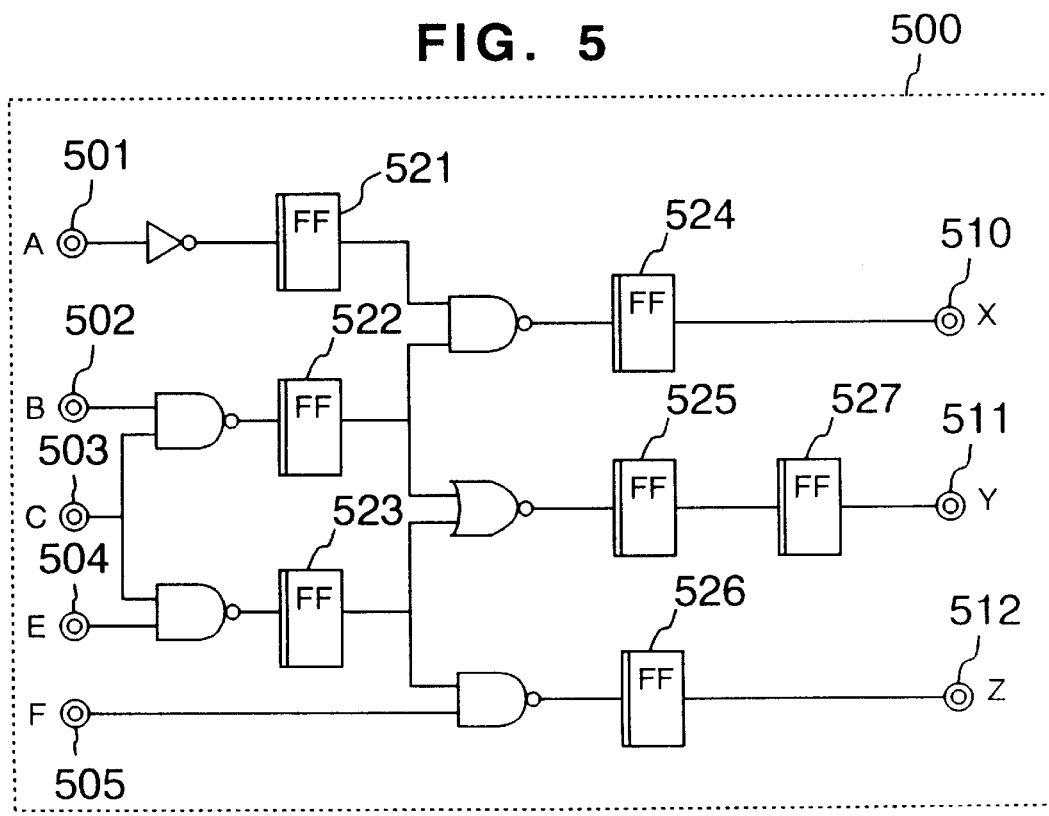
FIG. 5 is a diagram showing examples of a first intermediate circuit.

FIG. 4 shows an example of the old circuit, and FIG. 5 shows an example of the first intermediate circuit. The circuit updating system 103 first identifies corresponding pairs of primary input terminals 401 to 404 of FIG. 4 and primary input terminals 501 to 505 of FIG. 5. Correspondence is identified by using a primary input signal name (name of a signal connected to each primary input terminal) as a search key. Primary input terminals having the same primary input signal name are corresponding primary input terminal pairs. The terminals 401 and 501, 402 and 502, and 403 and 503 constitute corresponding terminal pairs, and the terminals 404, 504, and 505 have no corresponding terminal. Similarly, correspondence between primary output terminals are identified by using a primary output signal name (name of a signal connected to each primary output terminal) as a search key. The terminals 411 and 510, and 412 and 511, constitute corresponding terminal pairs, and the terminals 410 and 512 have no corresponding terminal. Next, correspondence between FFs 421 to 427 of the old circuit 400 and FFs 521 to 526 of the first intermediate circuit 500 is identified. The number of primary input terminals of the first intermediate circuit is five, and the number of primary output terminals thereof is three. Since the number of primary input terminals is larger than the number of primary output terminals, the common primary input signal ratio Rcis(Gi,Gj) is calculated. For example, in the case of FF 425 and FF 522, since Nis(425)=3, (A, B, C), Nis(522)=2, (B, C) and Ncis(425,522)=2, (B, C), the calculation yields:

Rcis(425,522)=50 (2/3+2/2)=83

The calculation results (example of calculations of common primary input signal ratio) of Rcis(Gi,Gj) of respective corresponding FF pairs are shown in FIG. 6. From the results shown in FIG. 6, corresponding FF pairs are identified in the descending order of common primary input signal ratio. In this case, the corresponding FF pairs are pairs of 421 and 521, 422 and 522, 425 and 524, and 423 and 523, whereas a collision FF group not identified by the common primary input signal ratio includes FFs of 426, 427, 525, and 527. Next, for the collision FF group, the common output FF ratio Rcof(Gi,Gj) is calculated. For example, in the case of FFs 427 and 527, since Nof(427)=1, (Y), Nof(527)=1, (Y), and Ncof(427,527)=1, (Y)

the calculation yields:

Rcof(427,527)=50 (1/1+1/1)=100

The calculation results (example of calculations of common output FF ratio) of Rcos(Gi,Gj) of respective corresponding FF pairs are shown in FIG. 7. From the results shown in FIG. 7, corresponding FF pairs are identified in the descending order of common output FF ratio. In this case, the corresponding FF pair is a pair of 427 and 527, and on the basis of this result a common output FF ratio is again calculated. In this case, a pair of 426 and 525 is the corresponding FF pair. Since FFs 424 and 526 have no common primary output signals and output FFs, they cannot constitute a corresponding FF pair. Step 301 is completed by the above operations.

Figure 8:
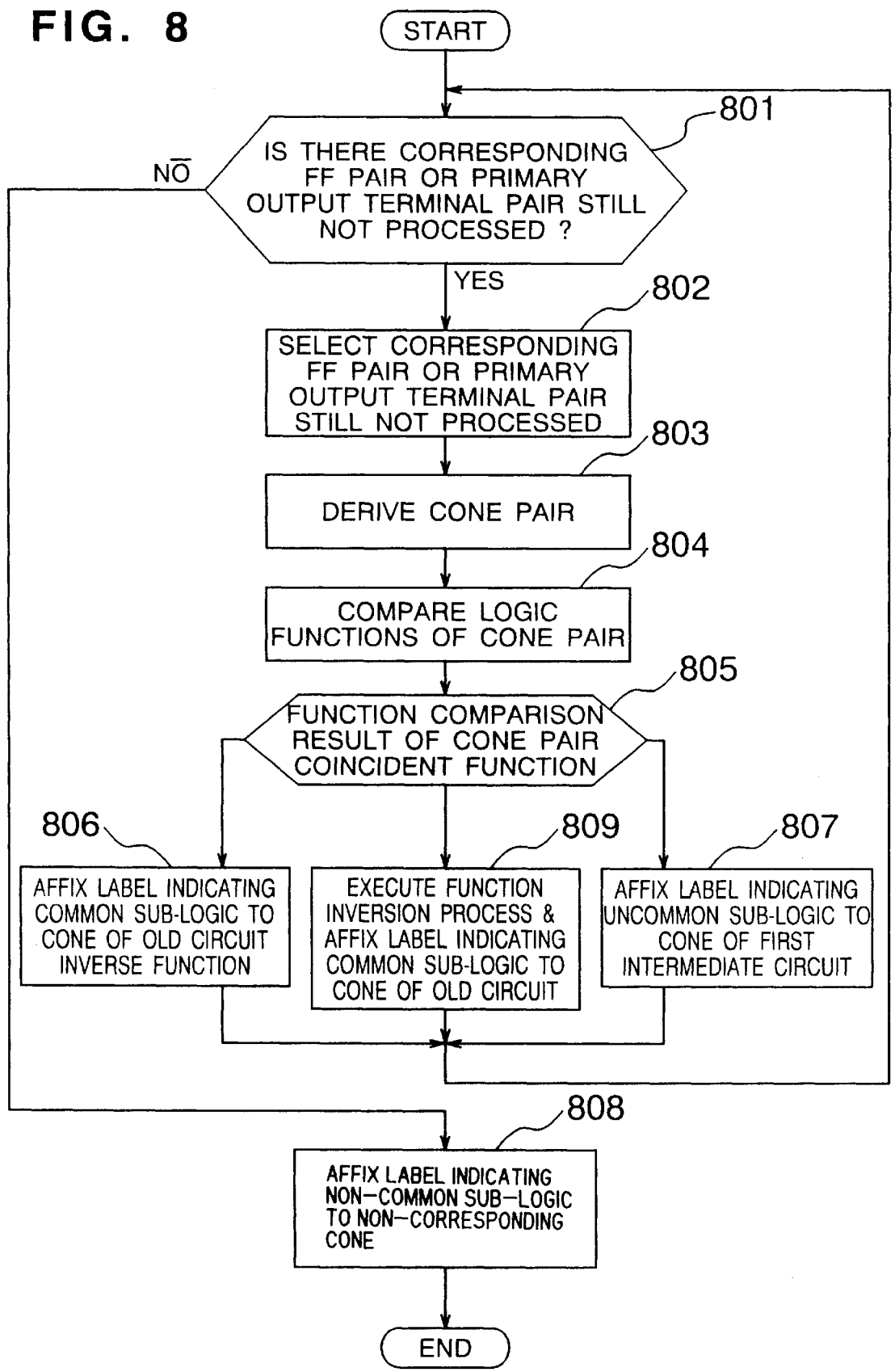
FIG. 8 is a flow chart illustrating a cone function comparison step.
Figure 9:
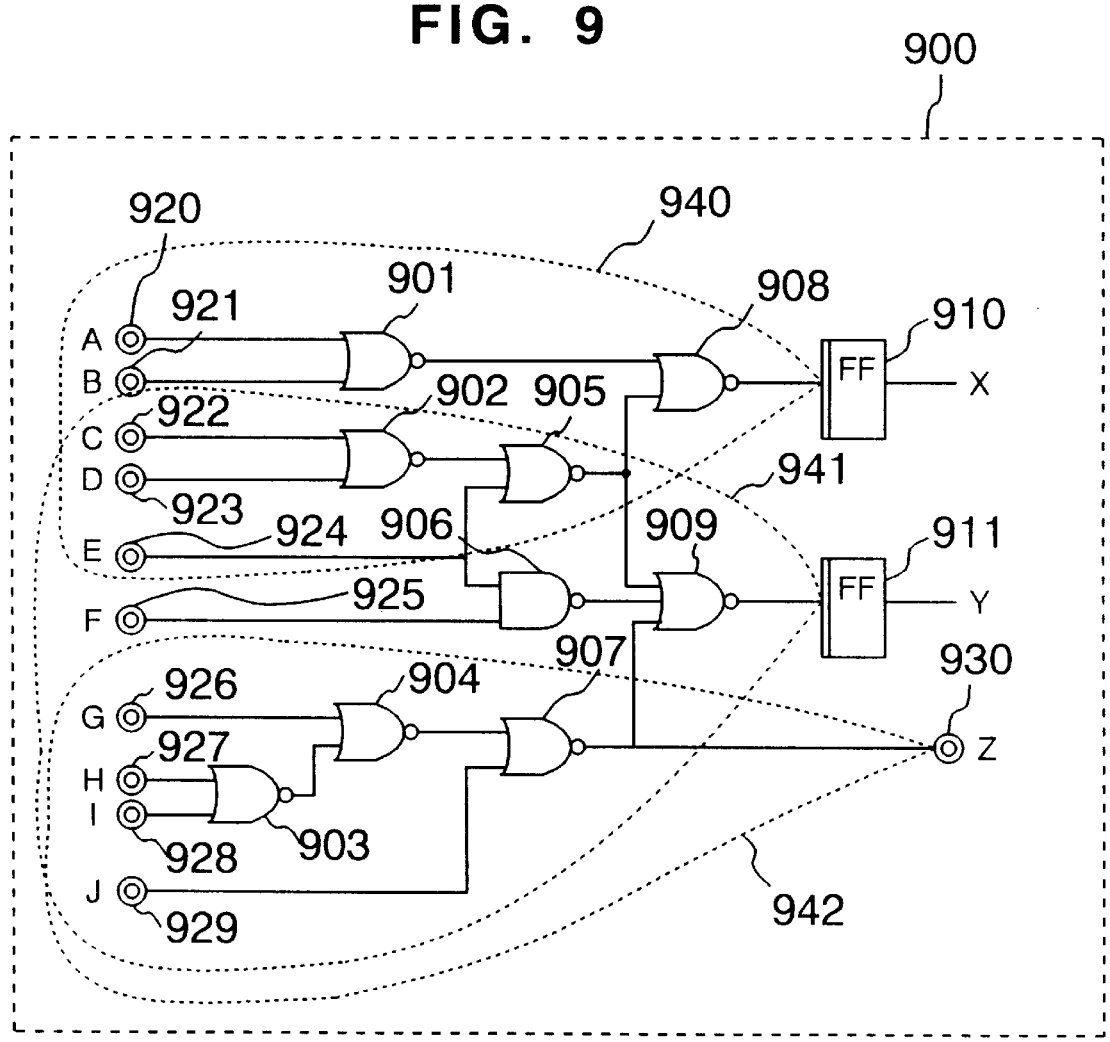
FIG. 9 is a diagram showing an example of an old circuit.
Figure 10:
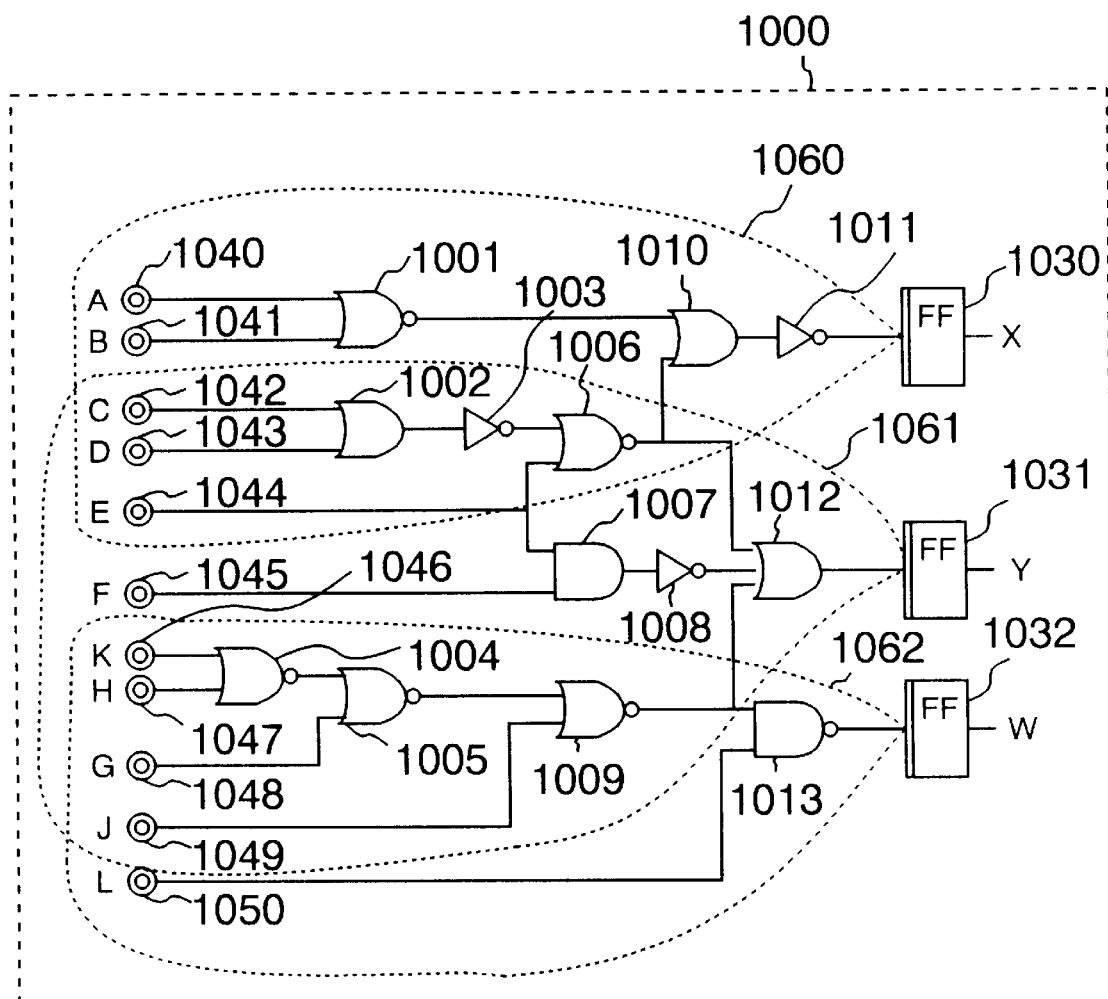
FIG. 10 is a diagram showing an example of a first intermediate circuit.

Step 302:

The functions of a cone pair having input terminals of each corresponding FF pair identified at Step 301 as output ports and a cone pair having same primary output terminals as the output ports are compared. FIG. 8 is a process flow at Step 302 (process flow of cone function comparison). Step 302 is constituted by Steps 801 to 808. The details of this process will be given by using examples of an old circuit 900 shown in FIG. 9 (contents of the circuit file 111 with optimization information) and a first intermediate circuit 1000 shown in FIG. 10 (contents of the updated circuit file 114).

Of primary input terminals 920 to 929 of the old circuit 900 and primary input terminals 1040 to 1050 of the first intermediate circuit 1000, a corresponding input terminal pair is assumed to be coupled to a primary input signal having the same signal name. There is no primary output terminal of the first intermediate circuit 1000, corresponding to the primary output terminal 903 of the old circuit 900. Corresponding FF pairs are a pair of 910 and 1030, and a pair of 911 and 1031, and FF 1032 has no corresponding FF.

Step 801:

It is checked whether there is a corresponding primary output terminal pair or FF pair still not processed. If there is such a pair, the flow advances to Step 802, and if not, it advances to Step 808. In this example, since there are corresponding FF pairs (910 and 1030, and 911 and 1031) still not processed, the flow advances to Step 802.

Step 802:

Corresponding primary output terminal pairs or FF pairs still not processed are selected one pair after another. In this example, a pair of FF 910 and FF 1030 is selected.

Step 803:

Cones formed by each primary output terminal pair or FF pair selected at Step 802 (cone having an output terminal as an output port or an input terminal of FF as the output port) are derived. In this example, a cone 940 having an input terminal of FF 910 as the output port and a cone 1060 having an input terminal of FF 1030 as the output port are derived through fan-in-trace toward the input side.

Step 804:

A function comparison of the cone pair selected at Step 803 is executed. For example, assuming that the logic function of the cone 940 is X=(A+B)·($\overline{C·D}$+E) where "-" represents a logical negation and the logic function of the cone 1060 is X=(A+B)·($\overline{C·D}$+E), the logic functions of these cones can be compared whether they are equivalent or not.

Step 805:

If the function comparison at Step 804 indicates that the logic function is equivalent, the flow advances to Step 806, if the logic function is inverse, the flow advances to Step 809, and if the logic function is neither equivalent nor inverse, the flow advances to Step 807. In this example, since the logic functions of the cones 940 and 1060 are equivalent, the flow advances to Step 806.

Step 806:

A label indicating a common sub-logic is affixed to all gates contained in the cone of the old circuit selected at Step 803. In this example, a label indicating a common sub-logic is affixed to the gates 901, 902, 905, and 908 in the cone 940.

Step 801:

In this example, there are corresponding FF pairs still not processed, so that the flow advances to Step 802.

Step 802:

In this example, FF 911 and FF 1031 are selected.

Step 803:

In this example, derived are the cone 941 having the input terminal of FF 911 as the output port and the cone 1061 having the input terminal of FF 1031 as the output port.

Step 804:

In this example, the logic function of the cone 941 is Y=(C+D)·$\overline{E·F}$·((H+I)·$\overline{G}$+J) and the logic function of the cone 1060 is Y=((C+D)·$\overline{E}$) $\oplus$ ($\overline{E·F}$)$\oplus$(($\overline{K·H}$+G)·J) where "$\oplus$" represents an exclusive or, so that the logic functions are not equivalent.

Step 805:

In this example, since the logic functions of the cones 941 and 1061 are neither equivalent nor inverse, the flow advances to Step 807.

Step 807:

A label indicating an uncommon sub-logic is affixed to all gates of the first intermediate circuit selected at Step 803. In this example, the label indicating the uncommon sub-logic is affixed to the gates 1002 to 1009 and 1012 of the cone 1061.

Step 801:

Since the first intermediate circuit 100 contains neither a corresponding primary output terminal pair nor FF pair still not processed, the flow advances to Step 808.

Step 808:

For all primary output terminals and FFs of the first intermediate circuit 1000 identified as having no corresponding pair, a label indicating the uncommon sub-logic is affixed to all gates contained in a cone having the primary output terminal as the output port and in a cone having an input terminal of FF as the output port. In this example, the label indicating the uncommon sub-logic is affixed to the gates 1004, 1005, 1009, and 1013 contained in the cone 1062 having the input terminal of FF 1032 as the output port. Since the label indicating the uncommon sub-logic has already been affixed to the gates 1004, 1005, and 1009 at Step 807, the label is affixed to only the gate 1013.

Figure 11A:
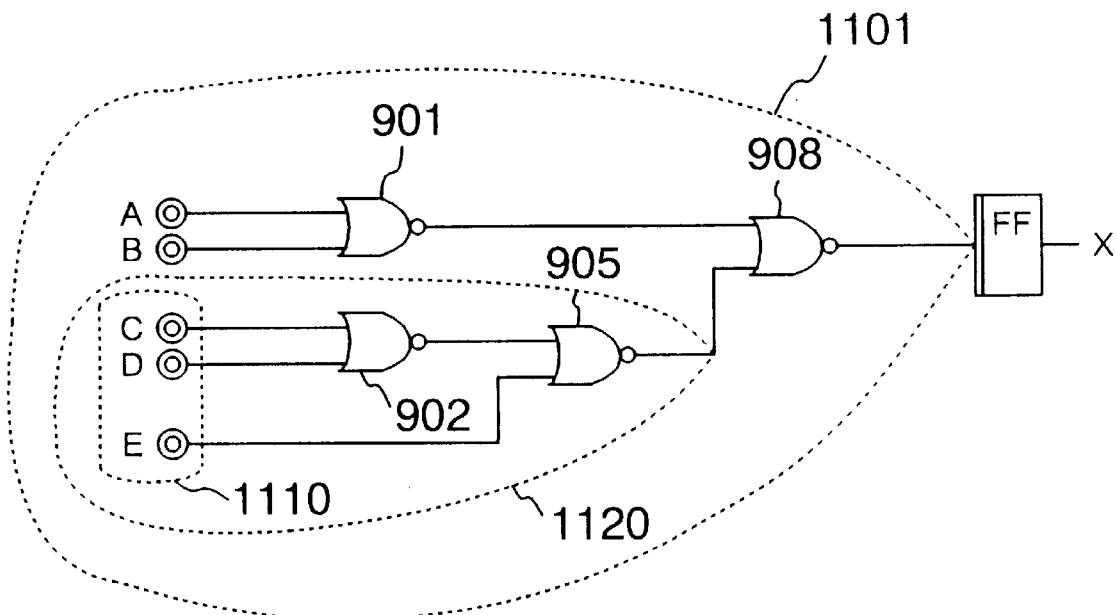
FIG. 11A is a diagram showing an example of a common sub-circuit.

FIGS. 11A and B show a sub-circuit 1101 of the old circuit constituted by the gates with the label indicating the common sub-logic and a sub-circuit 1102 of the first intermediate circuit constituted by the gates with the label indicating the uncommon sub-logic.

Step 303:

Duplicate sub-circuits having the equivalent function are discriminated from the sub-circuit (common sub-circuit) of the old circuit constituted by the gates with the label indicating the common sub-logic and from the sub-circuit (uncommon sub-circuit) of the first intermediate circuit constituted by the gates with the label indicating the uncommon sub-logic. A duplicate sub-circuit is deleted from the uncommon sub-circuit. In this example, the input port group (primary input signal or FF output signal) common to both the common sub-circuit 1101 and uncommon sub-circuit 1102 is selected therefrom. In this example, the input port signal group includes input port signals 1110 of the common sub-circuit 1101 and input port signals 1111 of the uncommon sub-circuit 1102 (they have the same signal names C, D, and E). Next, the sub-circuits (1120 and 1121) using only the input port group are derived from the common and uncommon sub-circuits, and the functions thereof are compared. Both the sub-circuits 1120 and 1121 have the same logic function $(C+D) \cdot \overline{E}$ and so they are duplicate sub-circuits. The duplicate sub-circuit 1121 is therefore deleted from the uncommon sub-circuit 1102, and the remaining circuit becomes a new uncommon sub-circuit 1130.

Figure 11B:
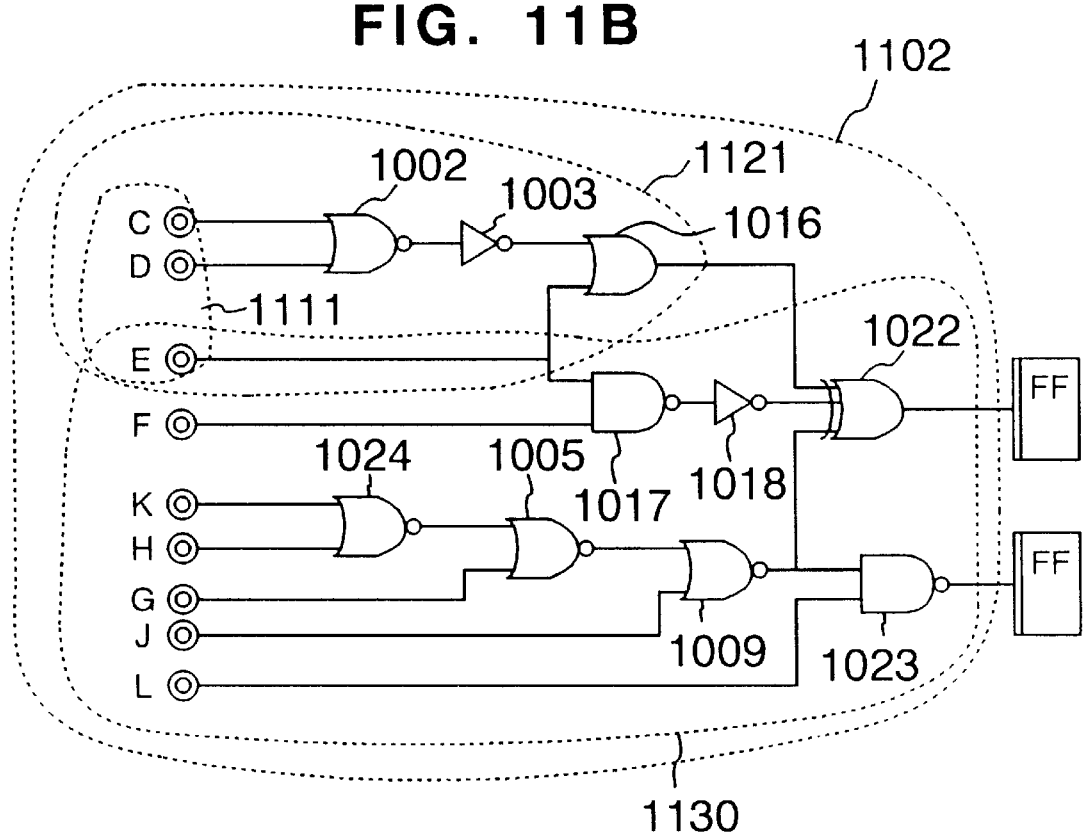
FIG. 11B is a diagram showing an example of an uncommon sub-circuit.
Figure 12:
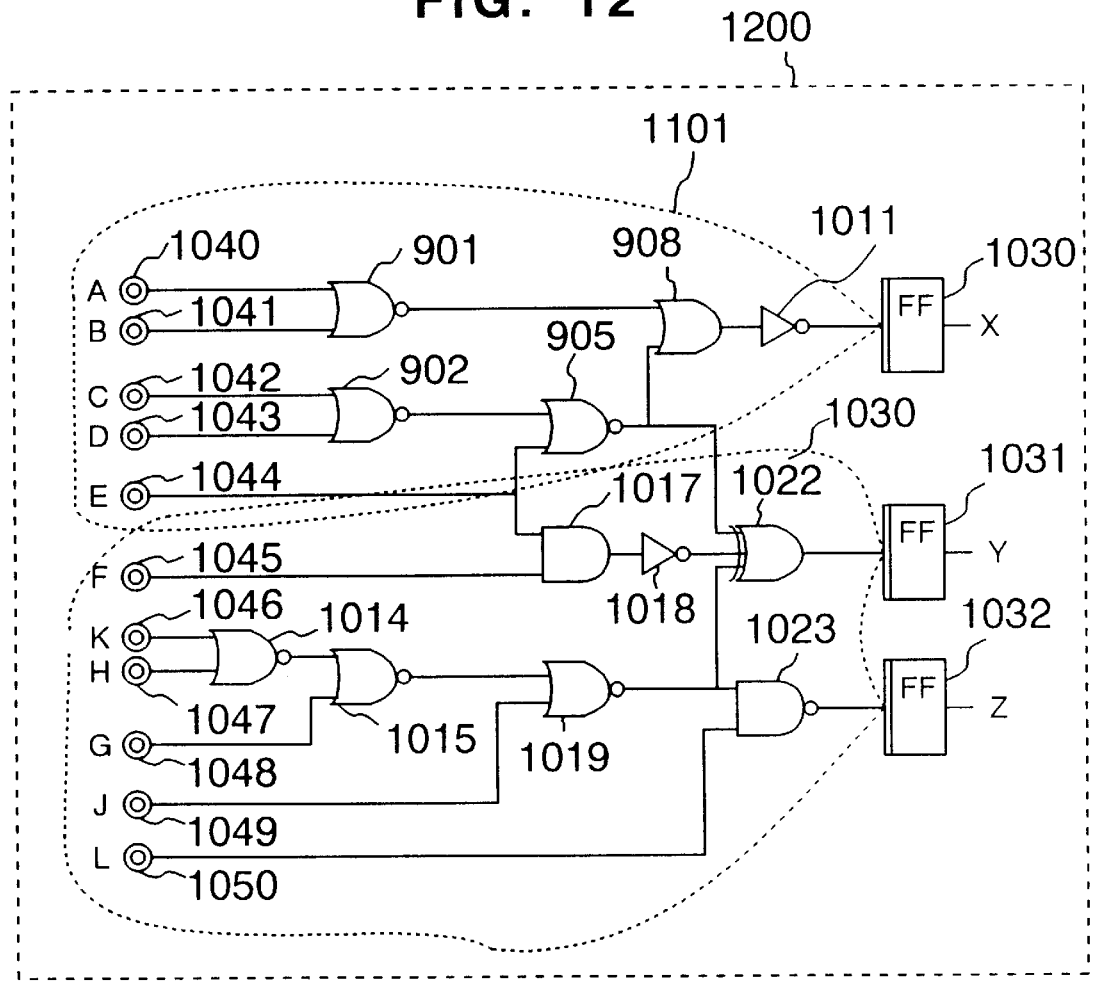
FIG. 12 is a diagram showing examples of a second intermediate circuit.

Step 304:

The common and uncommon sub-circuits obtained at Steps 302 and 303 and all primary input/output terminals and FFs of the first intermediate circuit are merged to generate a second intermediate circuit which is stored in the updated circuit file 115 with optimization information of the circuit portions need not be modified. The sub-circuit information already modified is stored in the information file 117 for already optimized circuit portions. In this example, the common sub-circuit 1101 and uncommon sub-circuit 1130 shown in FIG. 11 and all the primary input terminals 1040 to 1050 and FFs 1030 to 1032 are merged to generate a second intermediate circuit 1200 shown in FIG. 12. The common sub-circuit 1101 is outputted as the information of the circuit portions already optimized.

The circuit updating process is thus completed.

Next, the circuit optimizing process by the circuit optimizing system 104 will be described.

Figure 13:
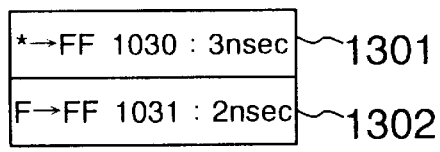
FIG. 13 is a diagram showing an example of constriction conditions.
Figure 14:
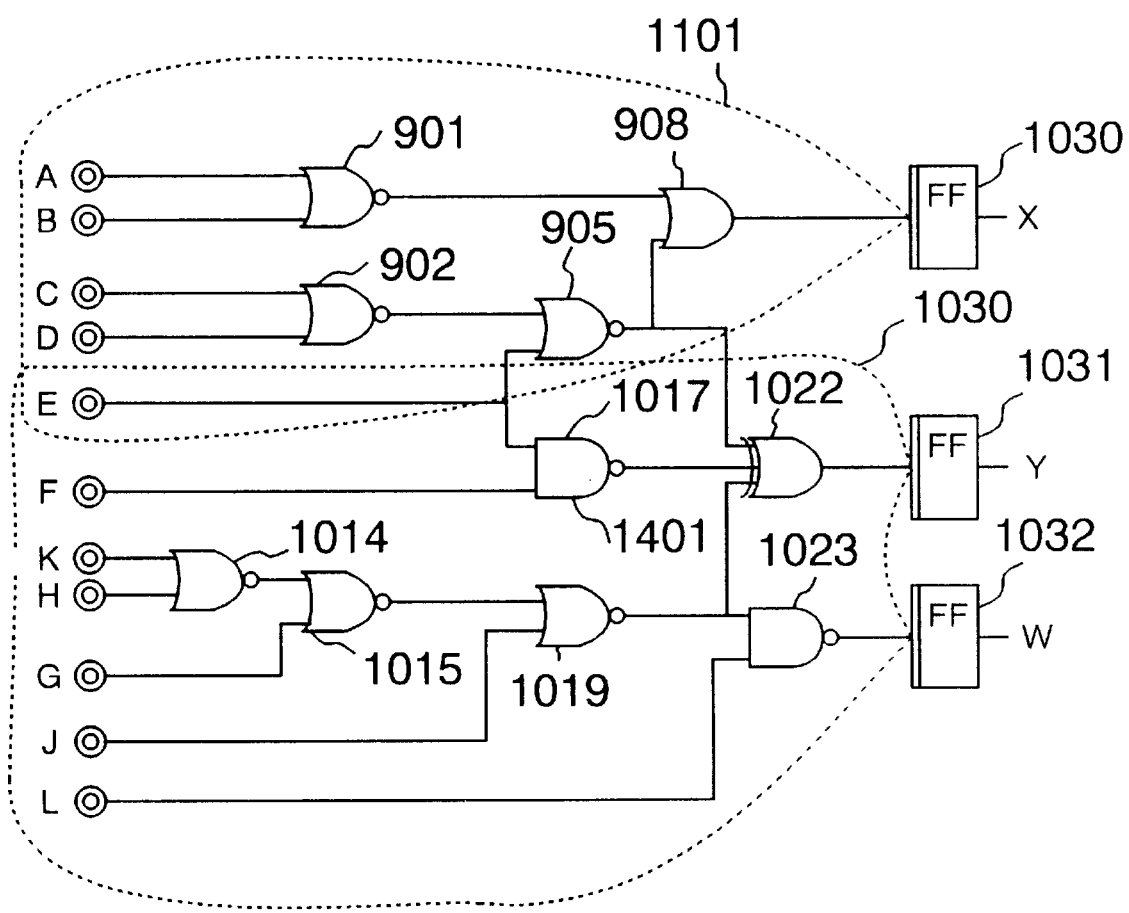
FIG. 14 is a diagram showing an example of an updated circuit with optimization information.

The circuit optimizing process derives the uncommon sub-circuit of the second intermediate circuit (contents of the updated circuit file 115 with optimization information of the circuit portions not needed to be modified) in accordance with information of the circuit portions already optimized (contents of information file 117 for already optimized circuit portions), and optimizes the circuit while referring to the constriction conditions (contents of the constriction condition file 112). An example of the constriction conditions is shown in FIG. 13. The conditions include a maximum delay of 3 nsec or smaller over signal paths from all primary input terminals to the input terminal of FF 1030 (condition 1301) and a maximum delay of 2 nsec or smaller over signal paths from the primary input terminal F to the input terminal of FF 1031 (condition 1302). In this example, it is assumed here that the delay of each gate in the second intermediate circuit 1200 is 1 nsec and the wiring delay is 0 nsec. Since all the signal paths of the condition 1301 are included in the common sub-circuit 1101, this condition is not relevant to optimization (the restriction condition has already been satisfied). On the other hand, the signal paths of the condition 1302 are those paths in the uncommon sub-circuit 1130 starting from the input terminal of FF 1031 and terminating at the input terminal of FF 1031 via the gates 1017, 1018, and 1022. Over these paths, the maximum delay is 3 nsec which does not satisfy the condition 1302. Therefore, these paths are required to be optimized. Therefore, the gates 1017 and 1018 are replaced by a single NAND gate to reduce the maximum delay to 2 nsec. This replacement results in the optimized circuit shown in FIG. 14 which is outputted to the updated circuit file 116 with optimization information. The NAND gate replaced for the gates 1017 and 1018 is represented by reference numeral 1401.

Figure 15:
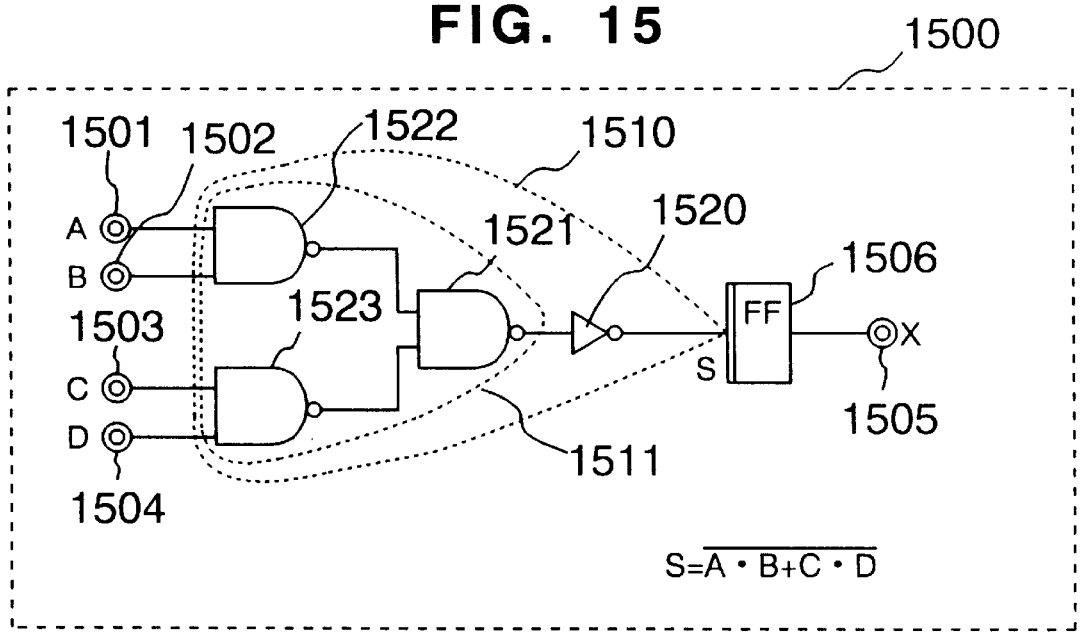
FIG. 15 is a diagram showing an example of an old circuit.
Figure 16:
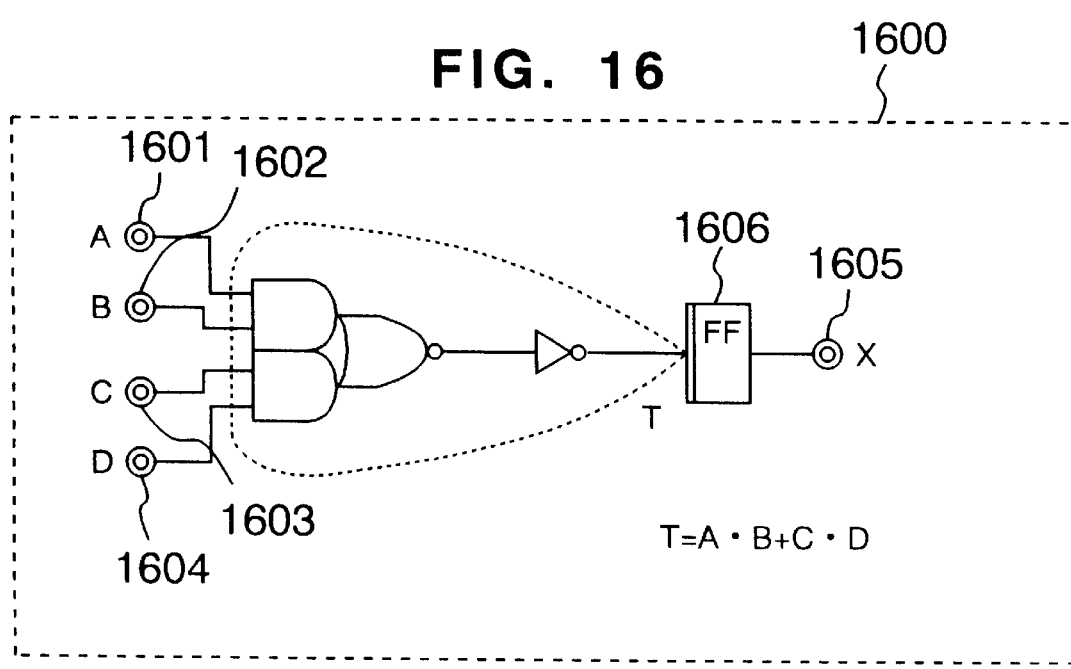
FIG. 16 is a diagram showing an example of a first intermediate circuit.

The process at Step 809 shown in FIG. 8 not described in the above embodiment will be finally described, by using examples of an old circuit 1500 shown in FIG. 15 (contents of the circuit file 111 with optimization information) and a first intermediate circuit 1600 shown in FIG. 16 (contents of the updated circuit file 114).

The primary input/output terminal group 1501 to 1505 of the old circuit and the primary input/output terminal group 1601 to 1605 of the first intermediate circuit 1600 are assumed to have a corresponding input/output terminal pair if the pair is coupled to a primary input/output signal having the same signal name. It is also assumed that by the process up to Step 803, an identified corresponding FF pair is a pair of FF 1506 of the old circuit and FF 1606 of the first intermediate circuit, and a cone 1510 from FF 1506 and a cone 1610 from FF 1606 have been derived.

Step 804:

In this example, the logic function of the cone 1510 is $S= \overline{A \cdot B + C \cdot D}$, and that of the cone 1610 is $T=A \cdot B+C \cdot D$. Although the logic functions are not equivalent, these functions are inverse since $S=\overline{T}$ is established.

Step 805:

In this example, since the logic functions of the cones 1510 and 1610 are inverse, the flow advances to Step 809.

Step 809:

It is checked whether the gate at the most output side of the cone of the old circuit selected at Step 803 has an inverting logic output terminal or whether it is an inverter. If it has an inverting logic output terminal, the output signal of the cone is switched to the inverting logic output terminal, and if it does no have an inverting logic output terminal and the gate at the most output side is an inverter, the inverter is deleted from the cone, whereas if it is not an inverter, an inverter is inserted at the most output side of the cone and the inserted inverter is considered to be the gate at the most output side of the cone. In this example, the gate 1520 at the most output side of the cone 1510 does not have an inverting logic output terminal but has an inverter. Therefore, the gate (inverter) 1520 is deleted from the cone 1510 and a new cone 1511 with the inverter 1520 being deleted is connected to FF 1506.

Next, at this Step, the label indicating a common sub-logic is affixed to all gates contained in the new cone of the old circuit changed by the above process. In this example, the label indicating the common sub-logic is affixed to the gates 1521 to 1523 contained in the cone 1511.

Figure 17:
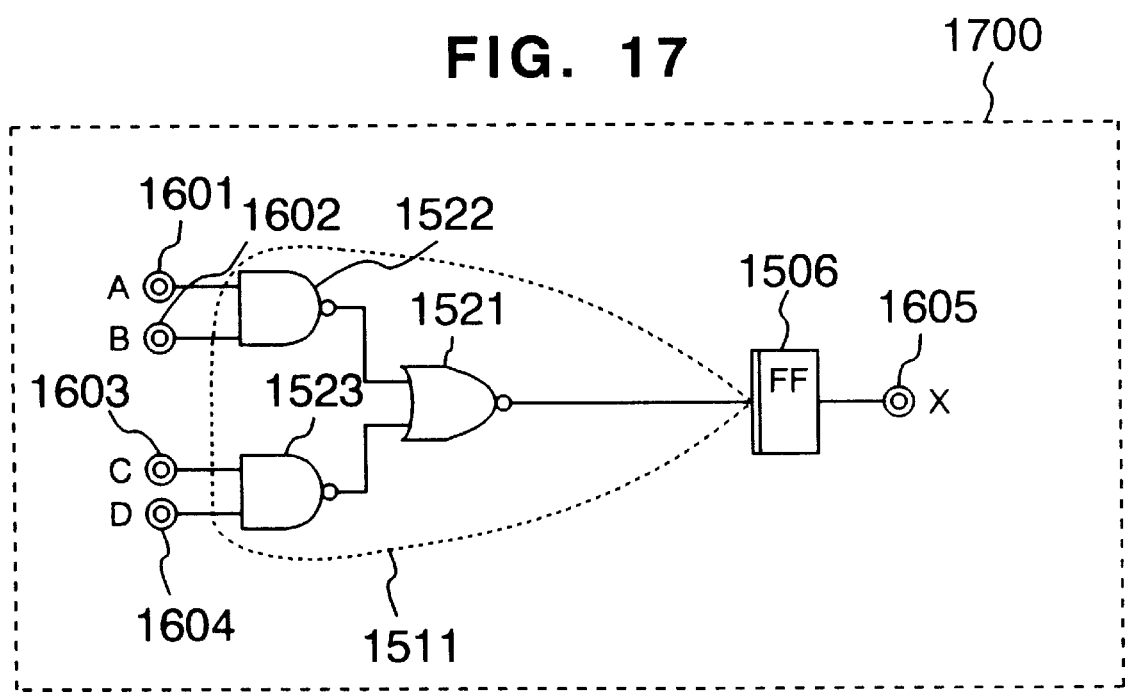
FIG. 17 is a diagram showing an example of a second intermediate circuit.

After the process following Step 801 to Step 304 is executed, a second intermediate circuit 1700 shown in FIG. 17 is generated.

What is claimed is:

1. An incremental logic synthesis system for generating an optimized circuit from given logic, wherein the optimized circuit satisfies a design constriction, comprising:
   an old logic file;
   an old circuit file for storing an old circuit generated from said old logic file and optimized to satisfy the design constriction;
   logic capture means for inputting a new logic file partially chanced from said old logic file;
   logic synthesizing means for generating a first intermediate circuit file for storing a first intermediate circuit from said new logic file;
   circuit updating means for discriminating a common sub-circuit of said old circuit having an equivalent logic function and an uncommon sub-circuit of said first intermediate circuit having an inconsistent logic function from said old circuit file and said first intermediate circuit file; and
   circuit optimizing means for generating a second intermediate circuit file for storing a second intermediate circuit, by merging the common sub-circuit of said old circuit and the uncommon sub-circuit of said first intermediate circuit and optimizing said uncommon sub-circuit of said second intermediate circuit so as to satisfy the design constriction,
   wherein said circuit updating means comprises:
   corresponding flip-flop pair discriminating means for discriminating a pair of flip-flops in said old circuit in said old circuit file and a flip-flop in said first intermediate circuit in said first intermediate circuit file, by using as a search key a name of a primary input/output signal to and from the circuit, and
   cone function comparing means for comparing the function of a cone having a gate combinational circuit with one output in said old circuit with the function of a cone having a gate combinational circuit with one output in said first intermediate circuit, selecting a circuit containing at least one gate in a cone of said old circuit with an equivalent logic function, as said common sub-circuit, and selecting a circuit containing a gate in a cone of said first intermediate circuit with an inconsistent logic function and a circuit containing a gate in a cone not identified as the comparison object, as said uncommon sub-circuit.

2. An incremental logic synthesis system according to claim 1, wherein said logic synthesizing means converts a Boolean algebra expression in a logic file into a corresponding gate circuit expression, a corresponding flip-flop circuit expression, and an interconnection circuit expression for interconnecting the corresponding gate circuit expression and the corresponding flip-flop circuit expression.

3. An incremental logic synthesis system according to claim 1, wherein said optimizing means includes judgement means for judging whether at least one of the conditions selected from a group consisting of the number of gates in the circuit, a power consumption of the circuit, and a layout of the circuit is satisfied or not, and for displaying the judgement result.

4. An incremental logic synthesis system according to claim 1, wherein said corresponding flip-flop pair discriminating means selects a pair of flip-flops in the order of larger common primary input signal ratio if the number of primary input signals to said first intermediate circuit is larger than the number of primary output signals from said first intermediate circuit, and if smaller, in the order of larger common primary output signal ratio.

5. An incremental logic synthesis system according to claim 4, wherein if a corresponding flip-flop pair cannot be identified by using said common primary input or output signal ratio, a pair of flip-flops is selected from an unidentified flip-flop pair group, by using at least one of indices including a common input flip-flop ratio and a common output flip-flop ratio.

6. An incremental logic synthesis system according to claim 1, wherein said cone function comparing means further judges whether one of a pair of cones with inconsistent logic functions has an inversion function of the other, if an inversion function, a new cone with an inversion function is formed either by deleting an inverter in the cone of said old circuit at the most output side, or inserting an inverter in the cone at the most output side, or switching a signal to an inverting output terminal of a gate of the cone at the most output side, and all gates contained in said new cone with an inversion function are added to the common sub-circuit of said old circuit.

7. An incremental logic synthesis method for generating an optimized circuit from given logic, wherein the optimized circuit satisfies a design constriction, comprising the steps of:
   inputting an old logic file, an old circuit file for storing an old circuit generated from said old logic file and optimized to satisfy the design constriction, and a new logic file partially changed from said old logic file;
   generating a first intermediate circuit file for storing a first intermediate circuit from said new logic file;
   updating by discriminating a common sub-circuit of said old circuit having an equivalent logic function and an uncommon sub-circuit of said first intermediate circuit having an inconsistent logic function from said old circuit file and said first intermediate circuit; and
   optimizing by generating a second intermediate circuit file for storing a second intermediate circuit, by merging the common sub-circuit of said old circuit and the uncommon sub-circuit of said first intermediate circuit, and optimizing said uncommon sub-circuit of said second intermediate circuit so as to satisfy the design constriction,
   wherein said updating step comprises the steps of:
   discriminating a corresponding flip-flop pair by discriminating a pair of flip flops in said old circuit in said old circuit file and a flip-flop in said first intermediate circuit in said first intermediate circuit file, by using as a search key a name of a primary input/output signal to and from the circuit, and comparing the function of a cone having a gate combinational circuit with one output in said old circuit with the function of a cone having a gate combinational circuit with one output in said first intermediate circuit, selecting a circuit containing at least one gate in a cone of said old circuit with an equivalent logic function, as said common sub-circuit, and selecting a circuit containing a gate in a cone of said first intermediate circuit with an inconsistent logic function and a circuit containing a gate in a cone not identified as the comparison object, as said uncommon sub-circuit.

8. An incremental logic synthesis method according to claim 7, wherein said generating step converts a Boolean algebra expression in a logic file into a corresponding gate circuit expression, a corresponding flip-flop circuit expression, and an interconnection circuit expression for interconnecting the corresponding gate circuit expression and the corresponding flip-flop circuit expression.

9. An incremental logic synthesis method according to claim 7, wherein said optimizing step includes a judgement step of judging whether at least one of the conditions selected from a group consisting of the number of gates in the circuit, a power consumption of the circuit, and a layout of the circuit is satisfied or not, and for displaying the judgement result.

10. An incremental logic synthesis method according to claim 7, wherein said corresponding flip-flop pair discriminating step selects a pair of flip-flops in the order of larger common primary input signal ratio if the number of primary input signals to said first intermediate circuit is larger than the number of primary output signals from said first intermediate circuit, and if smaller, in the order of larger common primary output signal ratio.

11. An incremental logic synthesis method according to claim 10, wherein if a corresponding flip-flop pair cannot be identified by using said common primary input or output signal ratio, a pair of flip-flops is selected from an unidentified flip-flop pair group, by using at least one of indices including a common input flip-flop ratio and a common output flip-flop ratio.

12. An incremental logic synthesis system for generating an optimized circuit from given logic, wherein the optimized circuit satisfies a design constriction, comprising:

an old logic file;

an old circuit file for storing an old circuit generated from said old logic file and optimized to satisfy the design constriction;

logic capture means for inputting a new logic file partially changing from said old logic file;

logic synthesizing means for generating a first intermediate circuit file for storing a first intermediate circuit from said new logic file;

circuit updating means for discriminating a common sub-circuit of said old circuit having an equivalent logic function and an uncommon sub-circuit of said first intermediate circuit having an inconsistent logic function from said old circuit file and said first intermediate circuit file; and circuit optimizing means for generating a second intermediate circuit file for storing a second intermediate circuit, by merging the common sub-circuit of said old circuit and the uncommon sub-circuit of said first intermediate circuit and optimizing said uncommon sub-circuit of said second intermediate circuit so as to satisfy the design constriction, wherein said circuit updating means comprises:

corresponding flip-flop pair discriminating means for discriminating a pair of flip-flops in said old circuit in said old circuit file and a flip-flop in said first intermediate circuit in said first intermediate circuit file, by using as a search key a name of a primary input/output signal to and from the circuit, and duplicate circuit deleting means for deleting a duplicate circuit contained both in said common sub-circuit of said old circuit file and in said uncommon sub-circuit of said first intermediate circuit file, from said first intermediate circuit, in accordance with an output from said corresponding flip-flop pair discriminating means.

13. An incremental logic synthesis system according to claim 12, wherein said duplicate circuit deleting means includes duplication judging means for discriminating said duplicate circuit by comparing the function of said common sub-circuit of said old circuit of said old circuit file with the function of a sub-circuit of said uncommon sub-circuit of said first intermediate circuit of said first intermediate circuit file, said sub-circuits having the same name of an input signal to said sub-circuits.

14. An incremental logic synthesis system for generating an optimized circuit from given logic, wherein the optimized circuit satisfies a design constriction, comprising:

an old logic file;

an old circuit file for storing an old circuit generated from said old logic file and optimized to satisfy the design constriction;

logic capture means for inputting a new logic file partially changing from said old logic file;

logic synthesizing means for generating a first intermediate circuit file for storing a first intermediate circuit from said new logic file;

circuit updating means for discriminating a common sub-circuit of said old circuit having an equivalent logic function and an uncommon sub-circuit of said first intermediate circuit having an inconsistent logic function from said old circuit file and said first intermediate circuit file; and circuit optimizing means for generating a second intermediate circuit file for storing a second intermediate circuit, by merging the common sub-circuit of said old circuit and the uncommon sub-circuit of said first intermediate circuit and optimizing said uncommon sub-circuit of said second intermediate circuit so as to satisfy the design constriction, wherein said circuit updating means comprises:

corresponding flip-flop pair discriminating means for discriminating a pair of flip-flops in said old circuit in said old circuit file and a flip-flop in said first intermediate circuit in said first intermediate circuit file, by using as a search key a name of a primary input/output signal to and from the circuit, and wherein said circuit optimizing means generates said second intermediate circuit file by merging said common sub-circuit of said old circuit file, said uncommon sub-circuit of said first intermediate circuit file, flip-flops in said first intermediate circuit, and primary input/output terminals of said first intermediate circuit of said first intermediate circuit file.

15. An incremental logic synthesis method for generating an optimized circuit from given logic, wherein the optimized circuit satisfies a design constriction, comprising the steps of:

inputting an old logic file, an old circuit file for storing an old circuit generated from said old logic file and optimized to satisfy the design constriction, and a new logic file partially changed from said old logic file;

generating a first intermediate circuit file for storing a first intermediate circuit from said new logic file;

updating by discriminating a common sub-circuit of said old circuit having an equivalent logic function and an uncommon sub-circuit of said first intermediate circuit having an inconsistent logic function from said old circuit file and said first intermediate circuit; and optimizing by generating a second intermediate circuit file for storing a second intermediate circuit, by merging the common sub-circuit of said old circuit and the uncommon sub-circuit of said first intermediate circuit, and optimizing said uncommon sub-circuit of said second intermediate circuit so as to satisfy the design constriction;

wherein said updating step comprises the steps of:

discriminating a corresponding flip-flop pair by discriminating a pair of flip flops in said old circuit in said old circuit file and a flip-flop in said first intermediate circuit in said first intermediate circuit file, by using as a search key a name of a primary input/output signal to and from the circuit, and deleting a duplicate circuit contained both in said common sub-circuit of said old circuit file and in said uncommon sub-circuit of said first intermediate circuit file, from said first intermediate circuit, in accordance with an output from said corresponding discriminating step.

16. An incremental logic synthesis method according to claim 15, wherein said deleting step comprises the step of:

judging by discriminating said duplicate circuit by comparing the function of said common sub-circuit of said old circuit of said old circuit file with the function of a sub-circuit of said uncommon sub-circuit of said first intermediate circuit of said first intermediate circuit file, said sub-circuits having the same name of an input signal to said sub-circuits.

17. An incremental logic synthesis method for generating an optimized circuit from given logic, wherein the optimized circuit satisfies a design constriction, comprising the steps of:

inputting an old logic file, an old circuit file for storing an old circuit generated from said old logic file and optimized to satisfy the design constriction, and a new logic file partially changing from said old logic file;

generating a first intermediate circuit file for storing a first intermediate circuit from said new logic file;

updating by discriminating a common sub-circuit of said old circuit having an equivalent logic function and an uncommon sub-circuit of said first intermediate circuit having an inconsistent logic function from said old circuit file and said first intermediate circuit; and optimizing by generating a second intermediate circuit file for storing a second intermediate circuit, by merging the common sub-circuit of said old circuit and the uncommon sub-circuit of said first intermediate circuit, and optimizing said uncommon sub-circuit of said second intermediate circuit so as to satisfy the design constriction;

wherein said updating step comprises the step of:

discriminating a corresponding flip-flop pair by discriminating a pair of flip flops in said old circuit in said old circuit file and a flip-flop in said first intermediate circuit in said first intermediate circuit file, by using as a search key a name of a primary input/output signal to and from the circuit; and wherein said circuit optimizing step comprises the step of:

generating said second intermediate circuit file by merging said common sub-circuit of said old circuit file, said uncommon sub-circuit of said first intermediate circuit file, flip-flops in said first intermediate circuit, and primary input/output terminals of said first intermediate circuit of said first intermediate circuit file.

\* \* \* \* \*